United States Patent
Smith

(10) Patent No.: US 12,274,057 B2
(45) Date of Patent: Apr. 8, 2025

(54) METHODS OF FORMING INTEGRATED CIRCUIT STRUCTURES COMPRISING ISOLATION STRUCTURES WITH DIFFERENT DEPTHS

(71) Applicant: MICRON TECHNOLOGY, INC., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/533,291

(22) Filed: Dec. 8, 2023

(65) Prior Publication Data

US 2024/0107754 A1 Mar. 28, 2024

Related U.S. Application Data

(60) Division of application No. 17/508,353, filed on Oct. 22, 2021, now Pat. No. 11,889,687, which is a continuation of application No. 16/527,552, filed on Jul. 31, 2019, now Pat. No. 11,171,148.

(51) Int. Cl.
| | |
|---|---|
| H10B 41/27 | (2023.01) |
| H10B 41/35 | (2023.01) |
| H10B 41/41 | (2023.01) |
| H10B 43/27 | (2023.01) |
| H10B 43/35 | (2023.01) |
| H10B 43/40 | (2023.01) |

(52) U.S. Cl.
CPC ............ *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(58) Field of Classification Search
CPC .................... H01L 21/76; H01L 21/76283
See application file for complete search history.

(56) References Cited

U.S. PATENT DOCUMENTS

| | | | |
|---|---|---|---|
| 6,306,727 B1 * | 10/2001 | Akram | H01L 21/76208 438/444 |
| 8,384,148 B2 | 2/2013 | Tessariol et al. | |
| 11,171,148 B2 | 11/2021 | Smith | |
| 2003/0170968 A1 | 9/2003 | Kim et al. | |
| 2005/0179072 A1 * | 8/2005 | Rhodes | H01L 27/14609 257/292 |

(Continued)

*Primary Examiner* — Nduka E Ojeh
(74) *Attorney, Agent, or Firm* — Dicke, Billig & Czaja, PLLC

(57) ABSTRACT

Method of forming an isolation structure might include forming a first conductive region in a first section of a semiconductor material, forming a first trench in a second section of the semiconductor material adjacent a first side of the first section of the semiconductor material and forming a second trench in a third section of the semiconductor material adjacent a second side of the first section of the semiconductor material, extending the first and second trenches to a depth below the first conductive region and removing a portion of the first section of the semiconductor material overlying the first conductive region, forming second and third conductive regions in the semiconductor material below bottoms of the first and second trenches, respectively, and forming a dielectric material overlying the first conductive region and filling the first and second trenches.

20 Claims, 17 Drawing Sheets

(56) References Cited

U.S. PATENT DOCUMENTS

| | | | |
|---|---|---|---|
| 2006/0043522 A1* | 3/2006 | Trivedi | H01L 21/76229 |
| | | | 257/E21.548 |
| 2008/0176378 A1 | 7/2008 | Batra et al. | |
| 2017/0103985 A1 | 4/2017 | Kim et al. | |
| 2019/0296012 A1* | 9/2019 | Iwata | H01L 21/76834 |

* cited by examiner

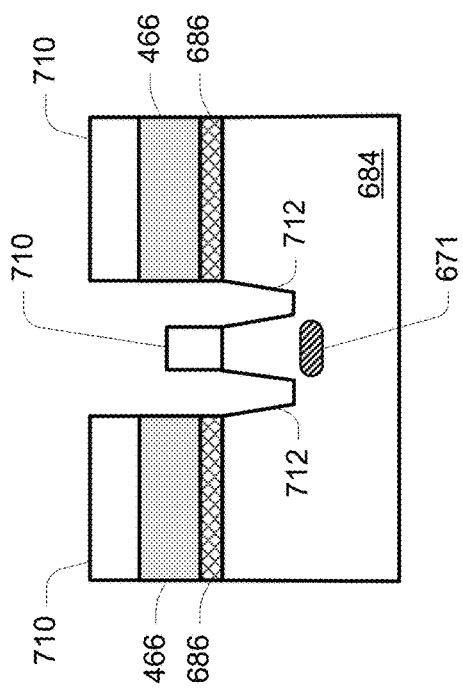
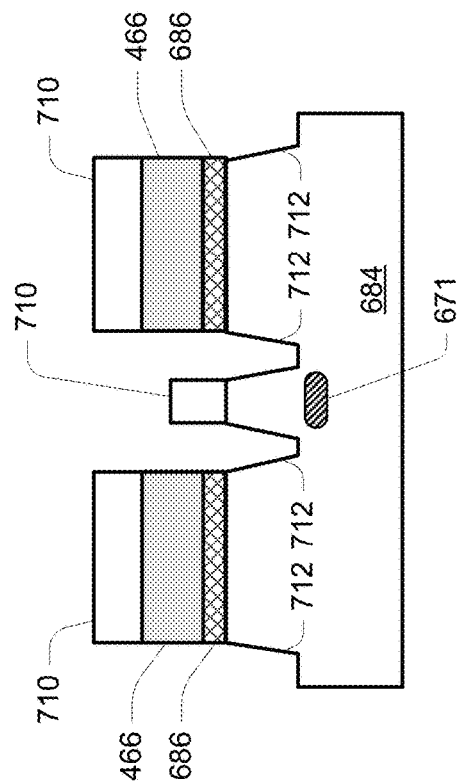
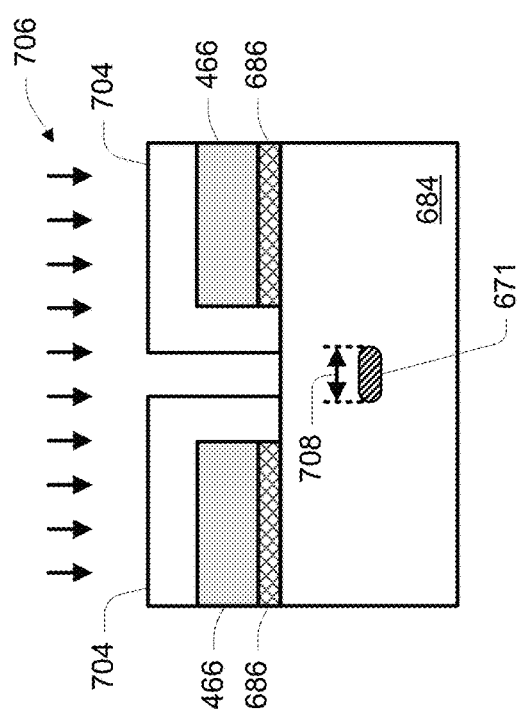
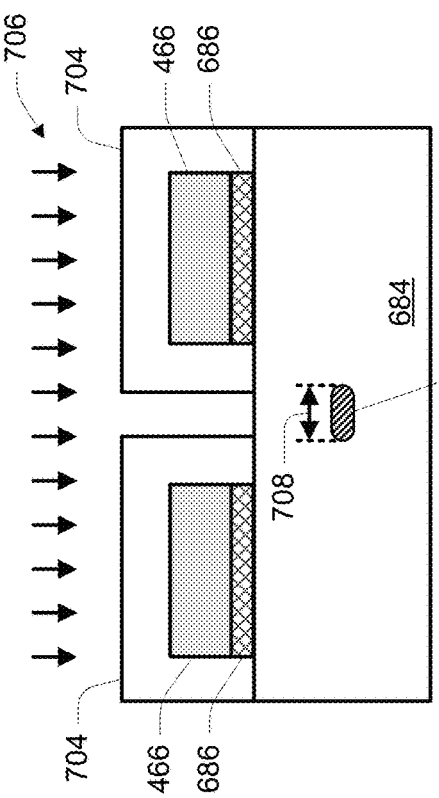
Fig. 7C
Fig. 8C
Fig. 7D
Fig. 8D

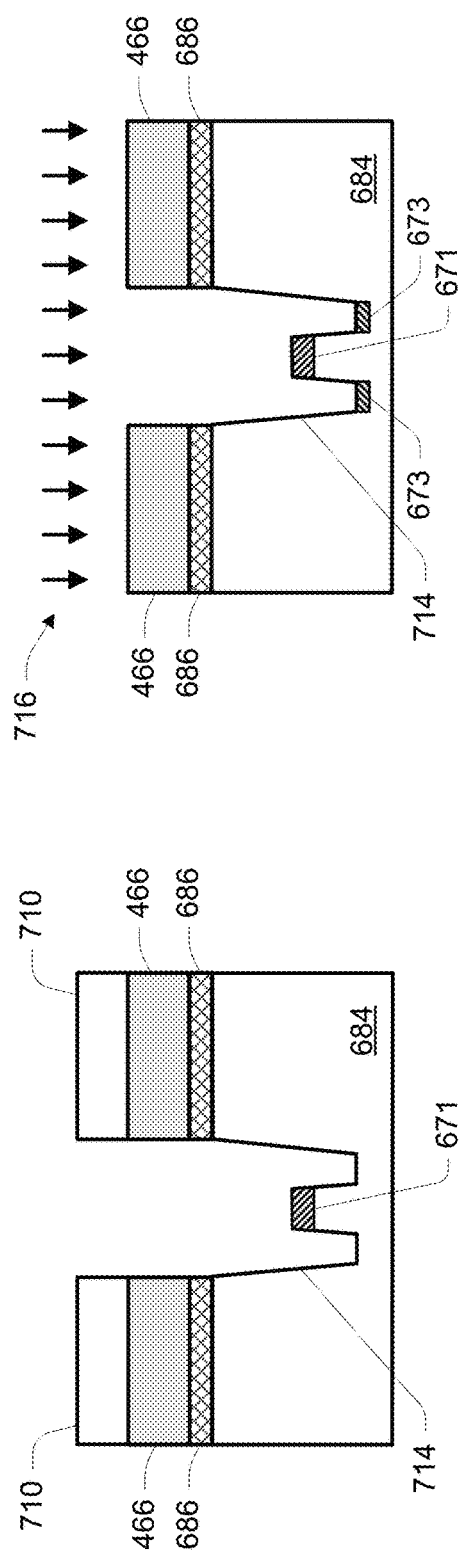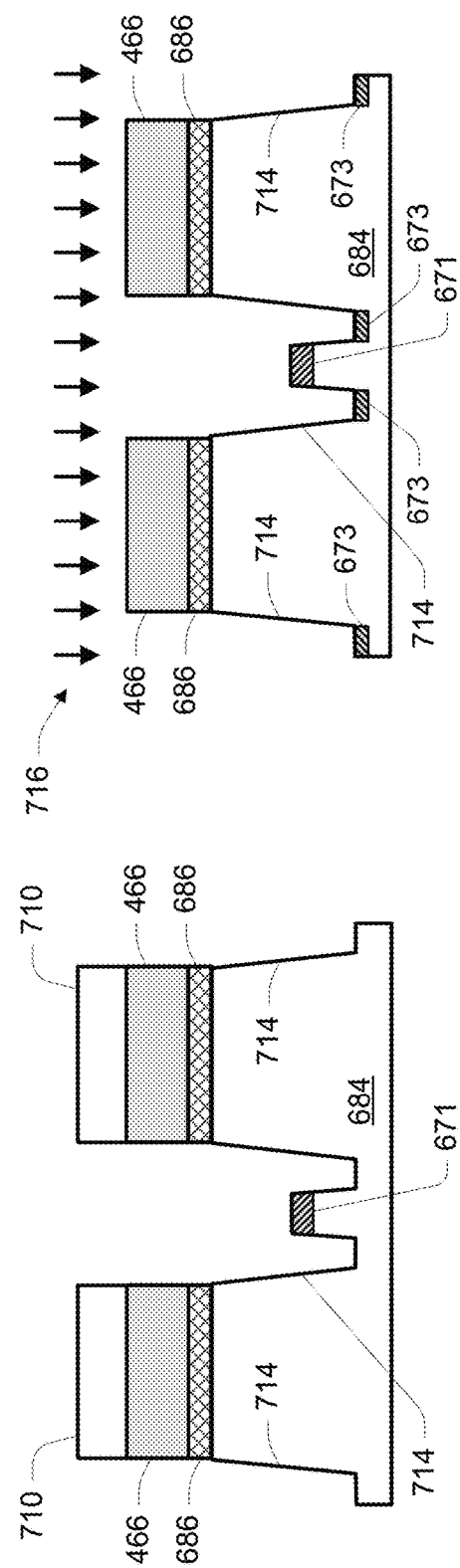

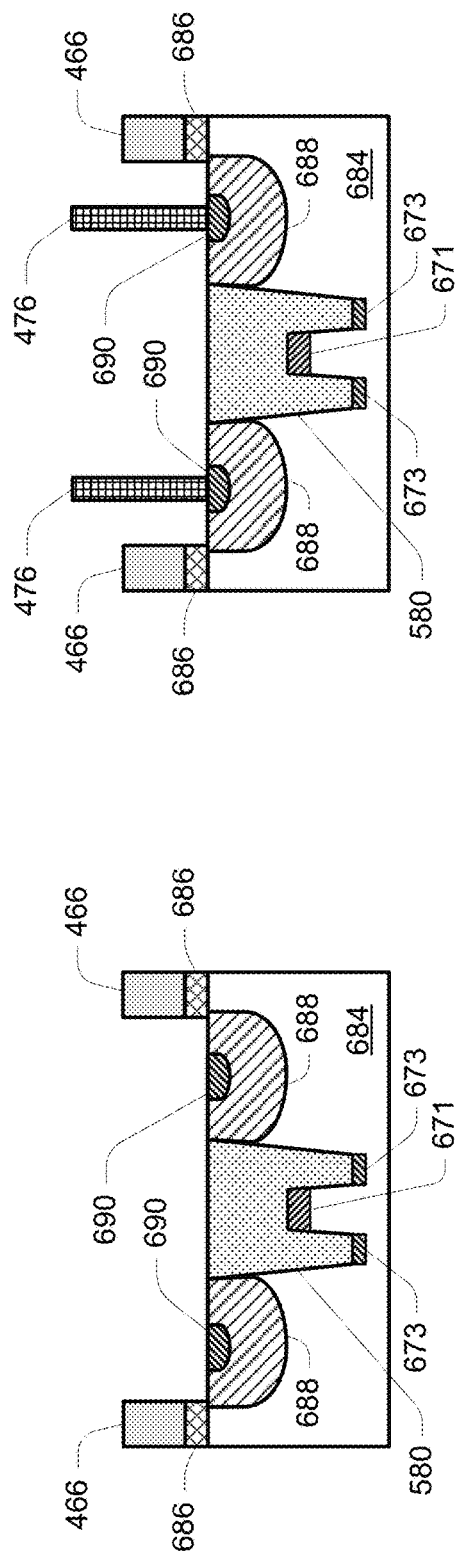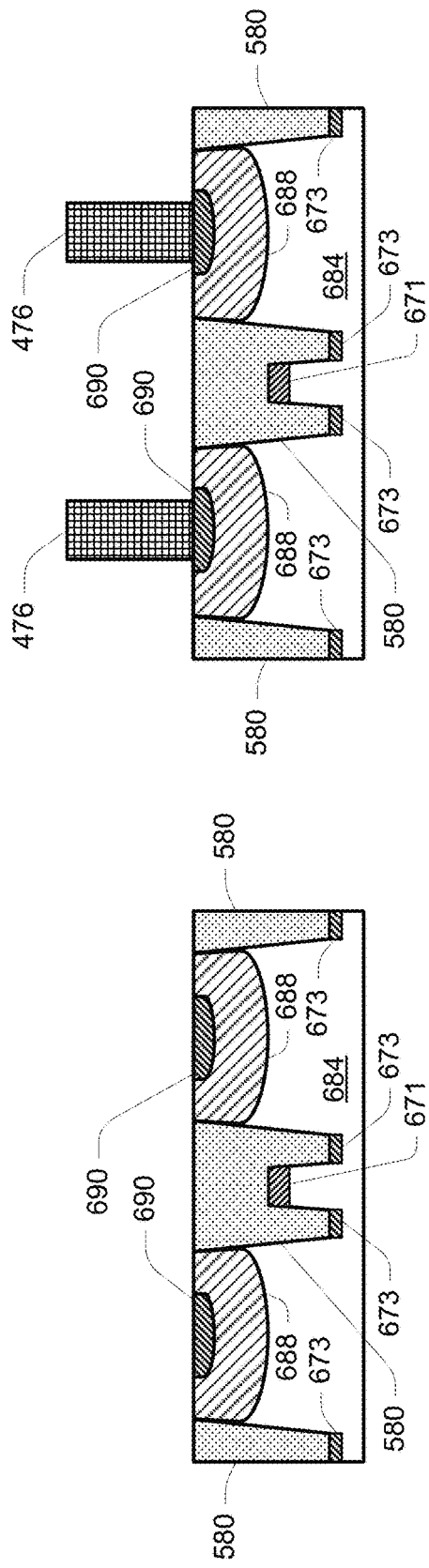

METHODS OF FORMING INTEGRATED CIRCUIT STRUCTURES COMPRISING ISOLATION STRUCTURES WITH DIFFERENT DEPTHS

RELATED APPLICATIONS

This Application is a Divisional of U.S. patent application Ser. No. 17/508,353, titled "INTEGRATED CIRCUIT STRUCTURES COMPRISING AN ISOLATION STRUCTURE WITH DIFFERENT DEPTHS," filed Oct. 22, 2021 (allowed), which is a Continuation of U.S. application Ser. No. 16/527,552, titled "ISOLATION STRUCTURES FOR INTEGRATED CIRCUIT DEVICES," filed Jul. 31, 2019, now U.S. Pat. No. 11,171,148, issued on Nov. 9, 2021 which are commonly assigned and incorporated herein by reference.

TECHNICAL FIELD

The present disclosure relates generally to integrated circuits and, in particular, in one or more embodiments, the present disclosure relates to isolation structures for integrated circuit devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In a memory device, access of memory cells (e.g., programming memory cells) often utilizes high voltage levels delivered to the control gates of those memory cells, which might exceed 20V. Gating such voltage levels often relies on transistors, such as field-effect transistors (FETs), having high breakdown voltages. Where these transistors are placed in close proximity to one another, isolation structures may be required between adjacent transistors.

BRIEF DESCRIPTION OF THE DRAWINGS

FIGS. 7A-7J and 8A-8J are cross-sectional views of isolation structures of FIG. 5E at various stages of fabrication in accordance with embodiments.

DETAILED DESCRIPTION

Figure 1:
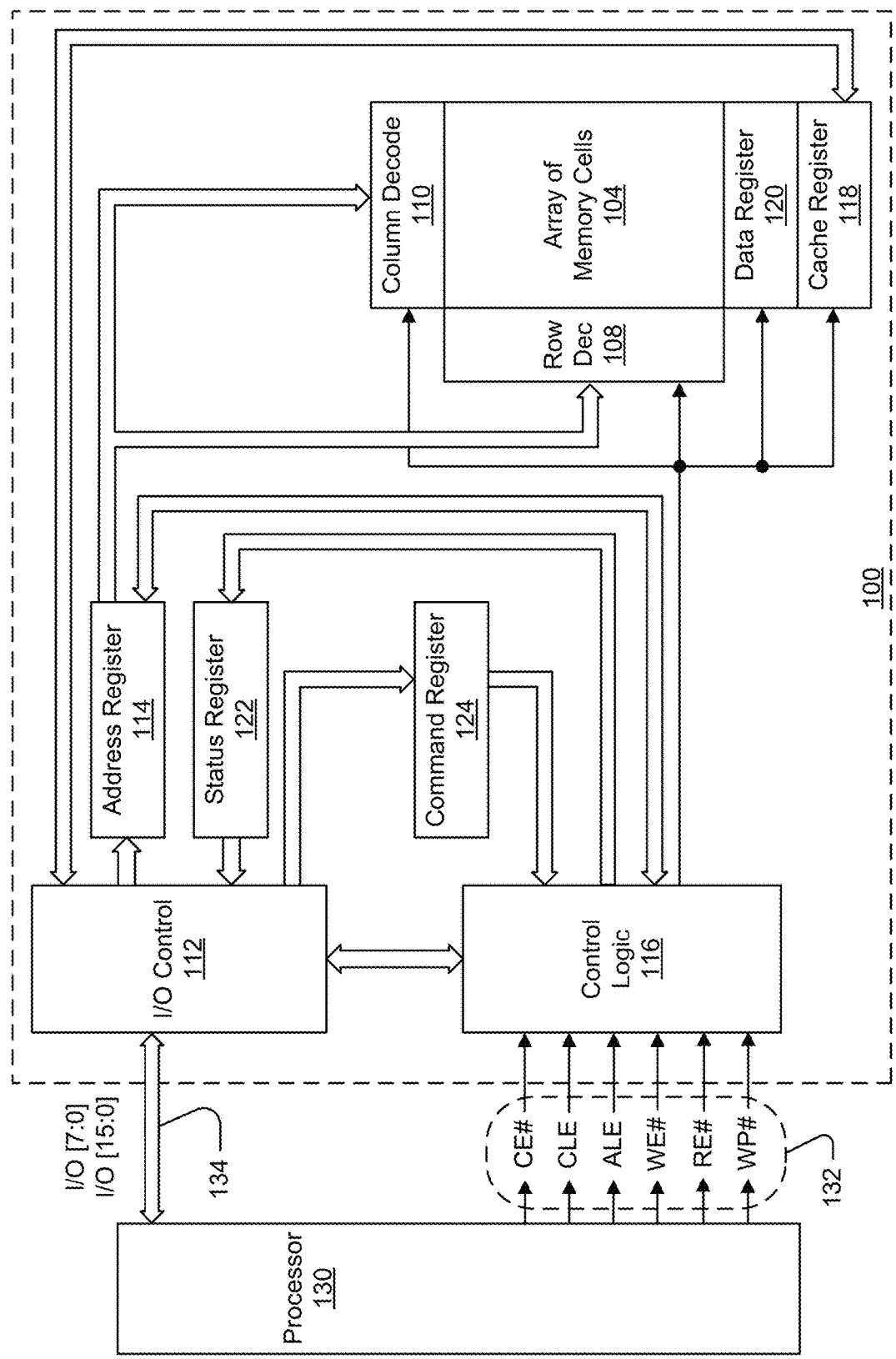
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

Various embodiments may facilitate isolation of high breakdown voltage transistors, e.g., field-effect transistors (FETs), through the use of isolation structures having a profile that might be referred to as W-shaped. Such embodiments may facilitate reduced spacing between such transistors while providing similar breakdown characteristics compared to prior art isolation structures. While isolation structures of various embodiments might be utilized in all types of integrated circuits, they will be described herein with specific reference to apparatus containing memory cells, some of which are commonly referred to as memory devices or simply memory.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. As one example, memory device 100 might contain isolation structures (not shown in FIG. 1) in accordance with embodiments. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
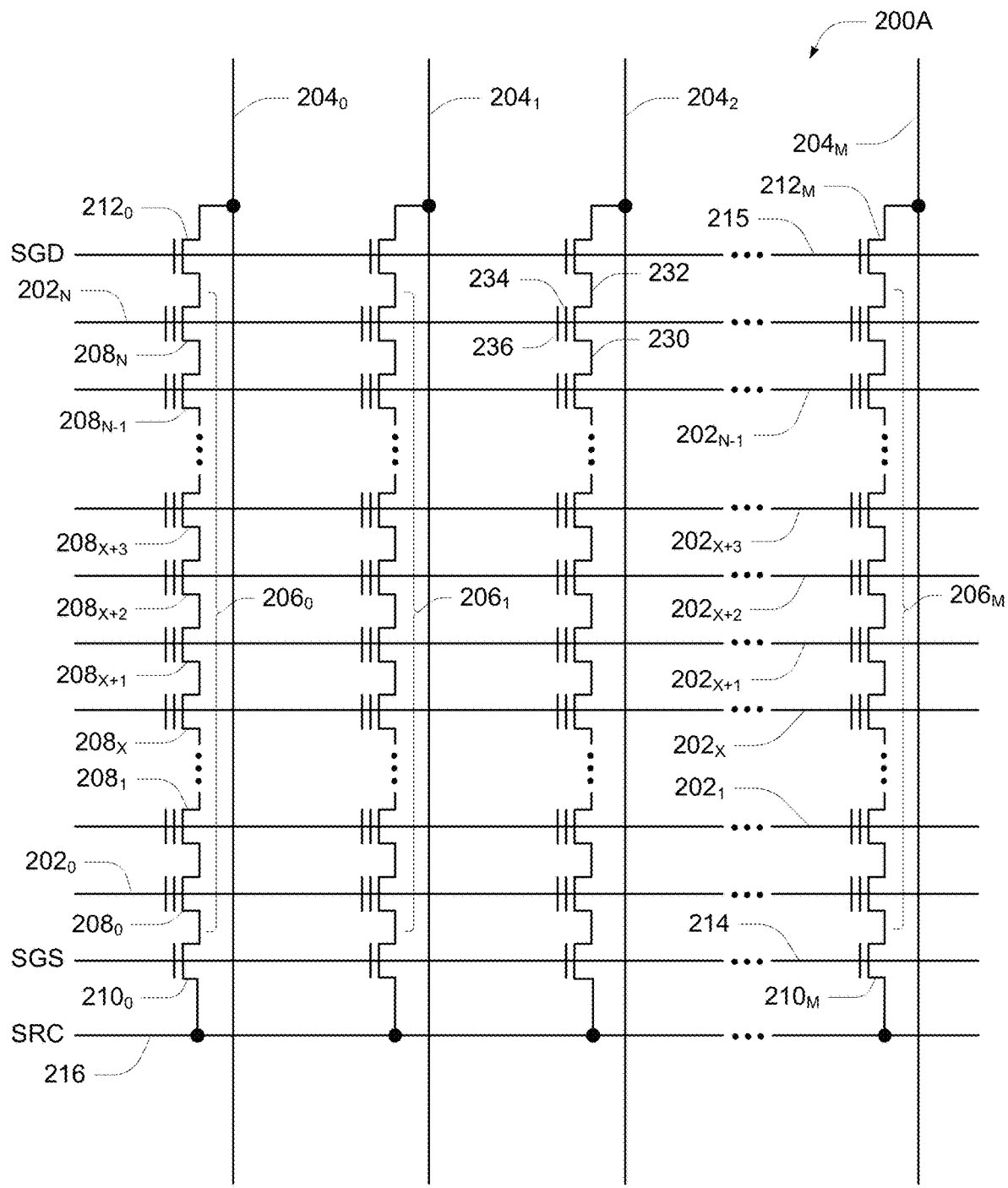
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
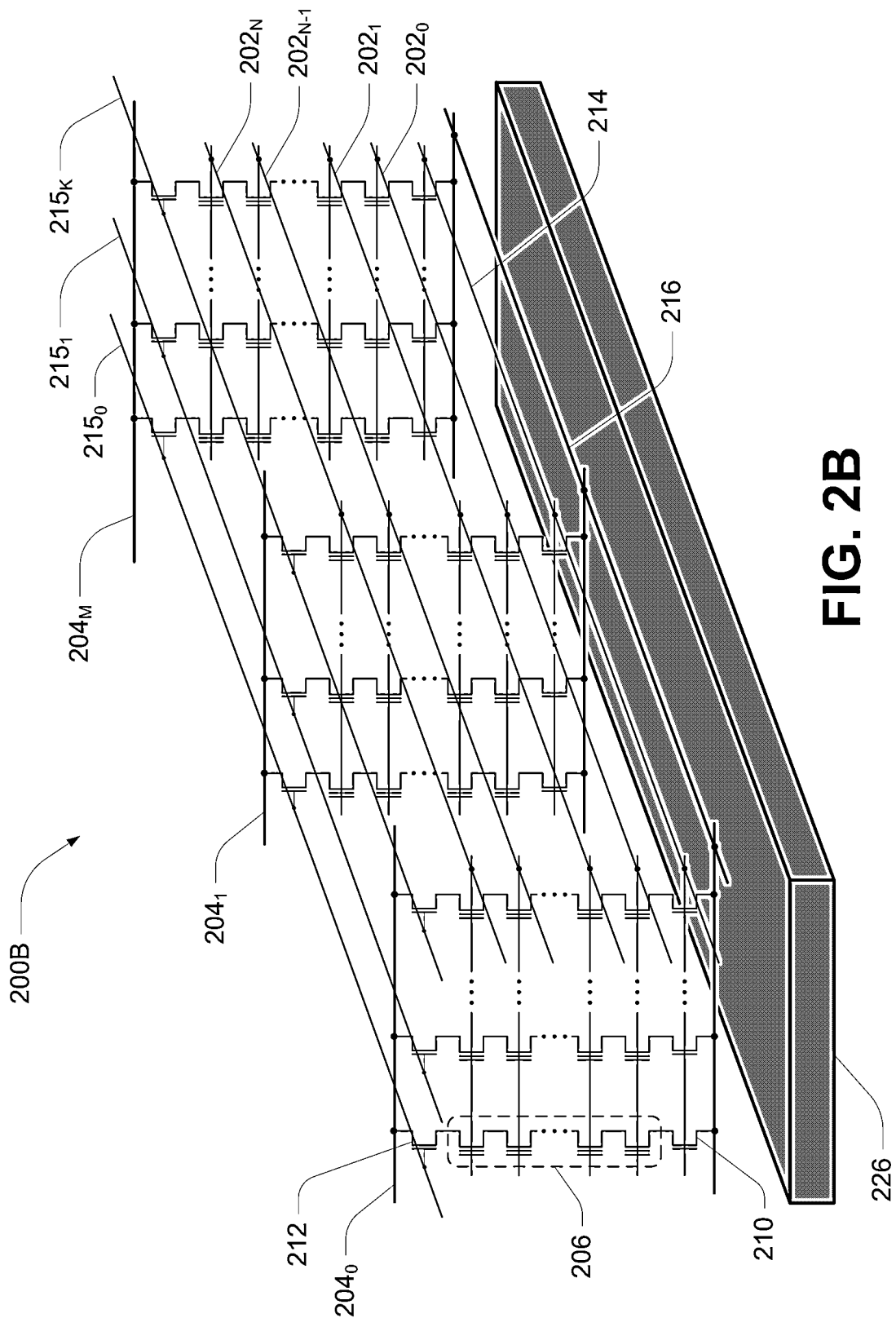

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include string drivers (not shown in FIG. 2B) for connection to word lines 202 of the memory array 200B and having isolation structures in accordance with embodiments. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
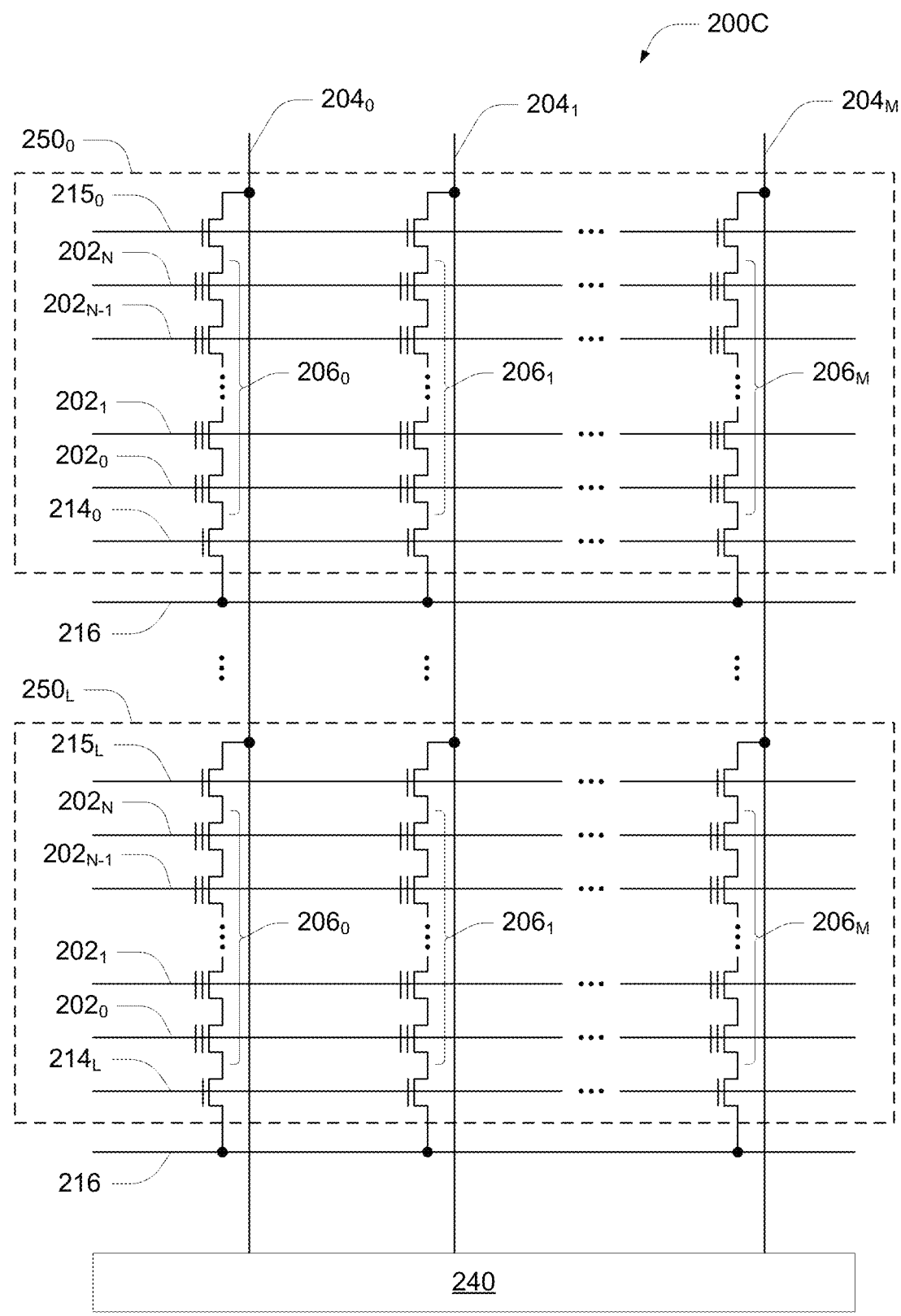

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
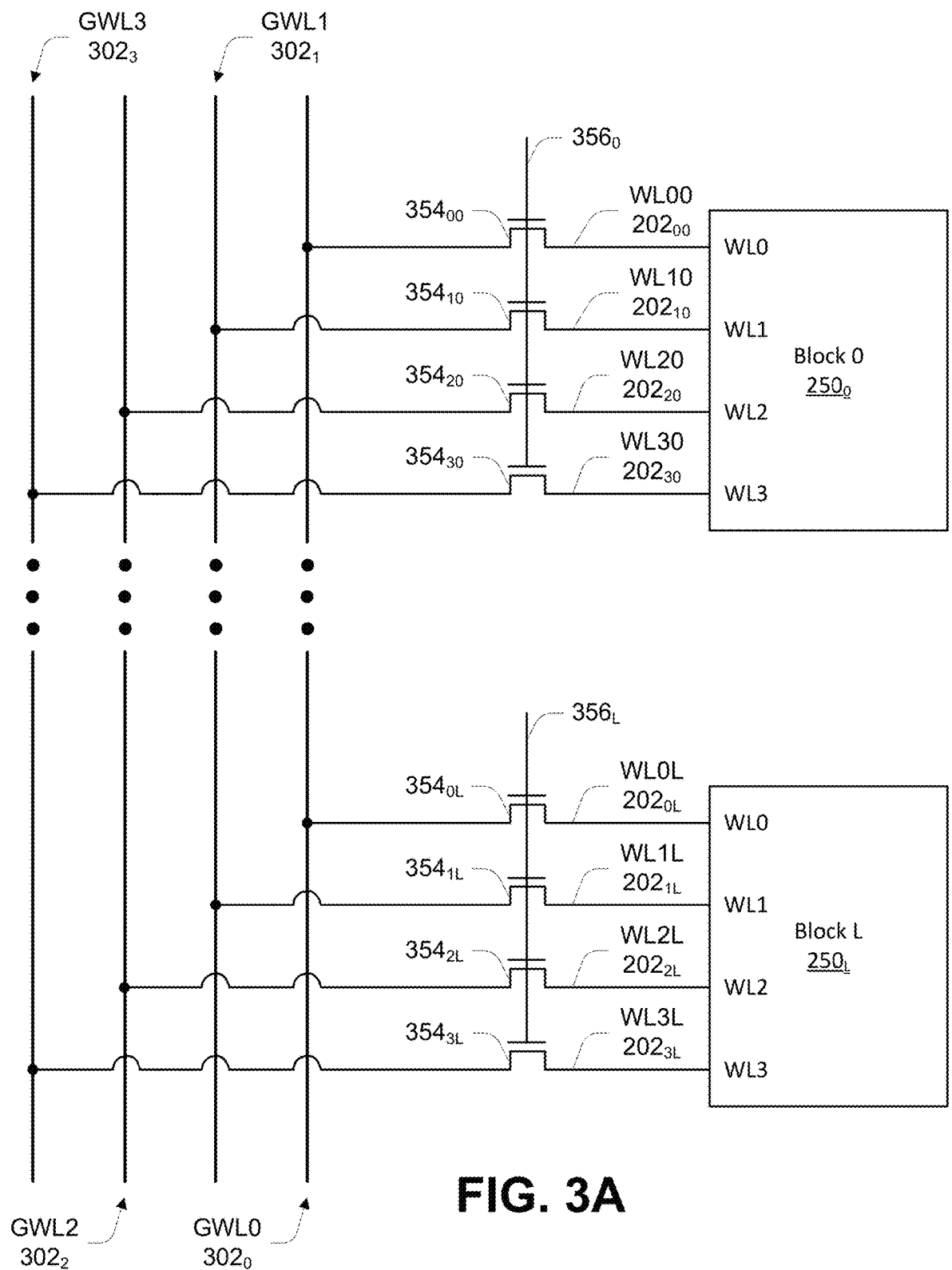
FIG. 3A is a schematic of a portion of an array of memory cells and string drivers as could be used in a memory device of the type described with reference to FIG. 1.

FIG. 3A is a schematic of a portion of an array of memory cells and string drivers as could be used in a memory device of the type described with reference to FIG. 1 and depicting a many-to-one relationship between local access lines (e.g., word lines 202) and global access lines (e.g., global word lines 302).

As depicted in FIG. 3A, a plurality of blocks of memory cells 250 may have their local access lines (e.g., word lines 202) commonly selectively connected to a plurality of global access lines (e.g., global word lines 302). Access lines $202_{00}$-$202_{30}$ and access lines $202_{0L}$-$202_{3L}$ might be referred to as respective subsets (e.g., mutually exclusive subsets) of access lines of a plurality (e.g., a same plurality) of access lines of an array of memory cells containing the plurality of blocks of memory cells 250. Although FIG. 3A depicts only blocks of memory cells $250_0$ and $250_L$ (Block 0 and Block L), additional blocks of memory cells 250 may have their word lines 202 commonly connected to global word lines 302 in a like manner. Similarly, although FIG. 3A depicts only four word lines 202, blocks of memory cells 250 may include fewer or more word lines 202.

To facilitate memory access operations to specific blocks of memory cells 250 commonly coupled to a given set of global word lines 302, each block of memory cells 250 may have a corresponding set of block select transistors 354 in a one-to-one relationship with their word lines 202. Control gates of the set of block select transistors 354 for a given block of memory cells 250 may have their control gates commonly coupled to a corresponding block select line 356. For example, for block of memory cells $250_0$, word line $202_{00}$ may be selectively connected to global word line $302_0$ through block select transistor $354_{00}$, word line $202_{10}$ may be selectively connected to global word line $302_1$ through block select transistor $354_{10}$, word line $202_{20}$ may be selectively connected to global word line $302_2$ through block select transistor $354_{20}$, and word line $202_{30}$ may be selectively connected to global word line $302_3$ through block select transistor $354_{30}$, while block select transistors $354_{00}$-$354_{30}$ are responsive to a control signal received on block select line $356_0$. The block select transistors 354 for a block of memory cells 250 might collectively be referred to as a string driver, or simply driver circuitry.

Figure 3B:
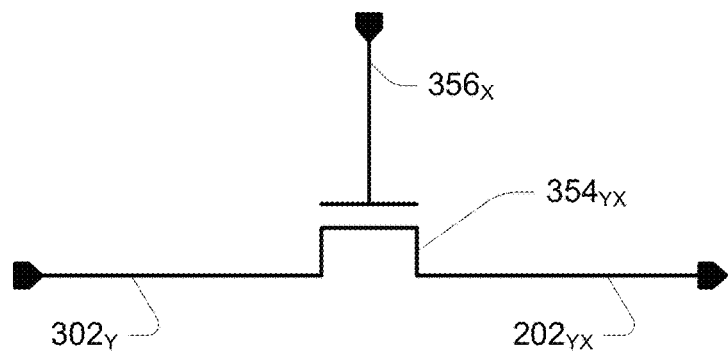
FIG. 3B is a schematic of a portion of one example of a string driver as could be used in a memory of the type described with reference to FIG. 1.

FIG. 3B is a schematic of a portion of one example of a string driver as could be used in a memory of the type described with reference to FIG. 1. The portion of the string driver of FIG. 3B depicts one transistor, e.g., block select transistor $354_{YX}$, responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having a control gate connected to the block select line $356_0$ and connected between the global word line $302_1$ and the local word line $202_{10}$ of the block of memory cells $250_0$. The block select transistor $356_{YX}$ might be a high-voltage n-type FET or nFET.

Figure 3C:
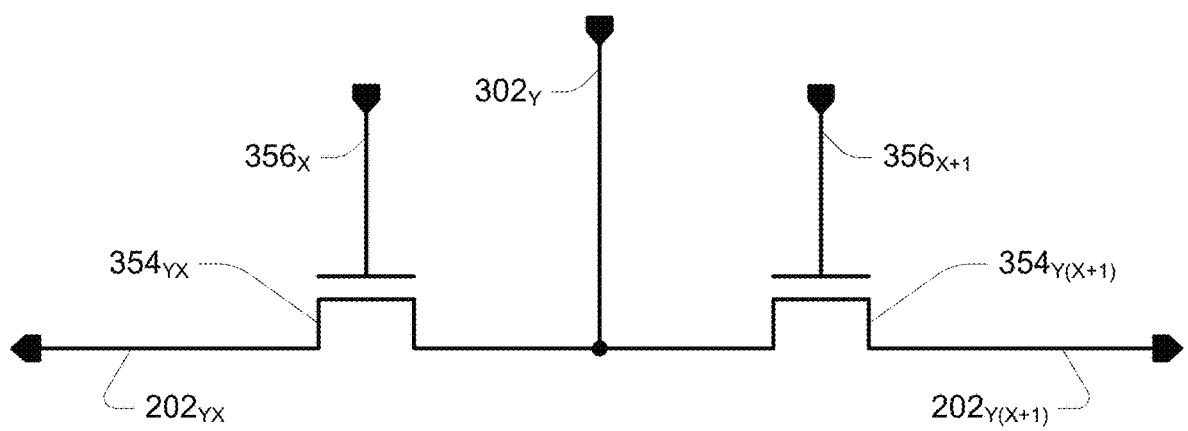
FIG. 3C is a schematic of a portion of another example of a string driver as could be used in a memory of the type described with reference to FIG. 1.

FIG. 3C is a schematic of a portion of another example of a string driver as could be used in a memory of the type described with reference to FIG. 1. The portion of the string driver of FIG. 3C depicts two transistors, e.g., block select transistor $354_{YX}$ and block select transistor $354_{Y(X+1)}$. Block select transistor $354_{YX}$ is responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having a control gate connected to the block select line $356_0$ and connected between the global word line $302_1$ and the local word line $202_{10}$ of the block of memory cells $250_0$.

Block select transistor $354_{Y(X+1)}$ is responsive to a control signal node, e.g., block select line $356_{X+1}$, and connected between a voltage node, e.g., the global word line $302_Y$, configured to supply a voltage level, and load node, e.g., local word line $202_{Y(X+1)}$, configured to receive that voltage level. For example, the block select transistor $354_{Y(X+1)}$ might represent the block select transistor $354_{1L}$ having a control gate connected to the block select line 356L and connected between the global word line $302_1$ and the local word line $202_{1L}$ of the block of memory cells $250_L$. The block select transistors $356_{YX}$ and $356_{Y(X+1)}$ might each be high-voltage n-type FETs or nFETs.

Figure 4:
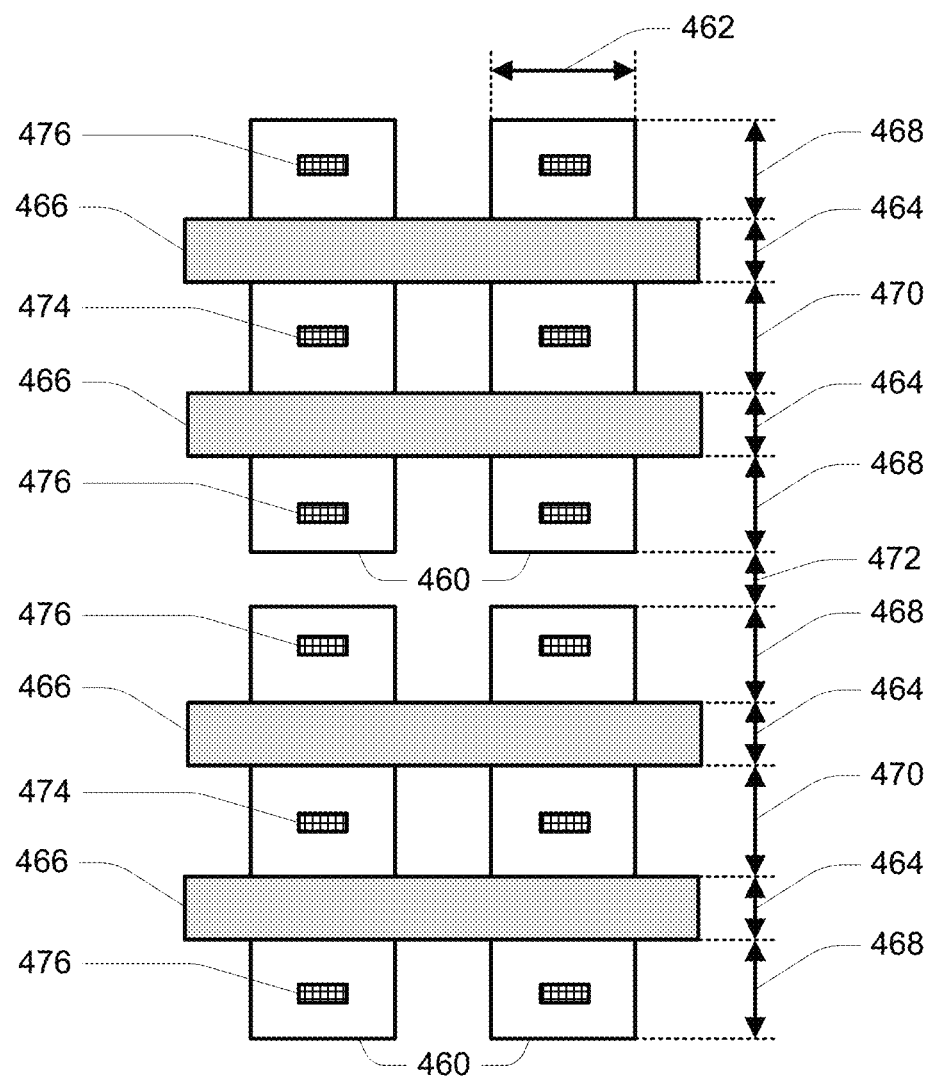
FIG. 4 is a plan view of transistors as might be used with embodiments.

FIG. 4 is a plan view of transistors as might be used with embodiments. The transistors of FIG. 4 might be represented by a schematic such as depicted in FIG. 3C. In FIG. 4, the transistors are formed in an active area 460 of a semiconductor, and may be separated from each other by isolation structures (not shown in FIG. 4) in accordance with embodiments. Each transistor might be formed between a first contact 474, e.g., for connection to a voltage node, and a second contact 476, e.g., for connection to a load node. Such transistors might be responsive to a control signal received on a conductor 466, which might be connected to (and might form) a control gate of one or more transistors.

Each active area 460 might have a width 462. A distance 464 might represent a width of a conductor 466, a distance 468 might represent the distance between an edge (e.g., nearest edge) of a conductor 466 and an end (e.g., nearest end) of the active area 460, a distance 470 might represent a distance between adjacent edges of the conductors 466, and a distance 472 might represent a distance between adjacent ends of active areas 460. An active area 460 might have a length equal to a sum of the distances 464, 468 and 470 between its ends.

FIGS. 5A-5E are plan views showing placement of isolation structures in accordance with embodiments. FIGS. 5A-5E might represent placement of isolation structures between adjacent active areas 460 of transistors of the type depicted in FIG. 4. Orientation of such isolation structures might be parallel to conductors forming control gates of the transistors, e.g., positioned between adjacent source/drain regions of adjacent transistors, and/or orthogonal to a conductor (e.g., a same conductor) forming the control gates of the transistors, e.g., positioned between adjacent channel regions of adjacent transistors. Depiction of contacts 474 and 476, and conductors 466, is omitted in FIGS. 5A-5D for clarity.

Figure 5A:
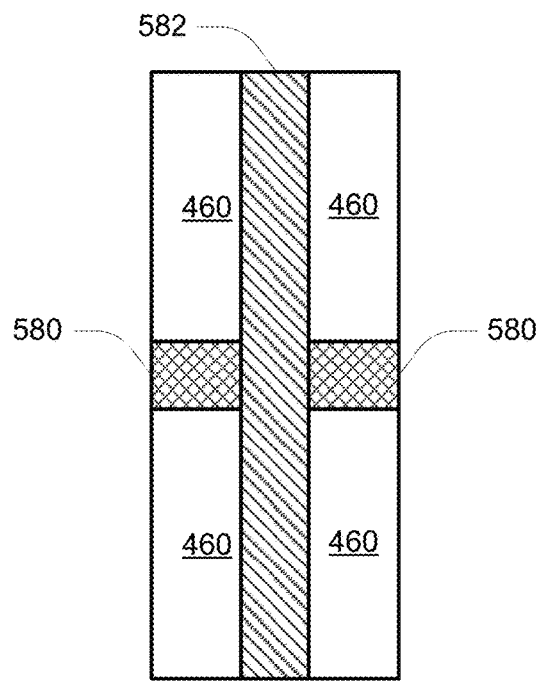
FIGS. 5A-5E are plan views showing placement of isolation structures in accordance with embodiments.
Figure 5B:
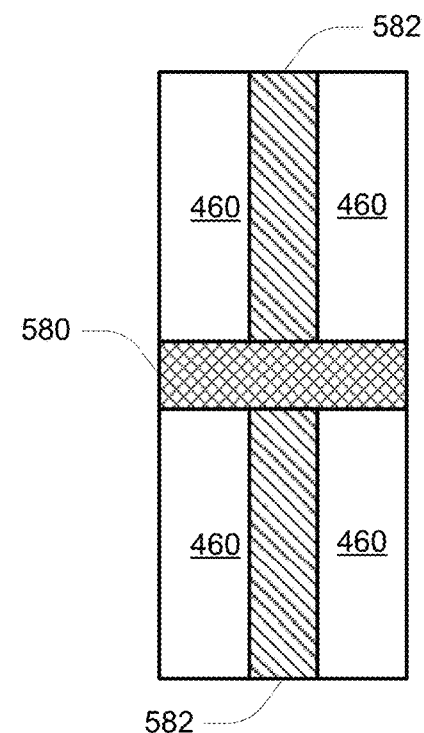

FIG. 5A depicts isolation structures 580 in accordance with an embodiment positioned between adjacent source/drain regions of adjacent transistors, and separated by an isolation structure 582 (e.g., a contiguous isolation structure) of the related art positioned between adjacent channel regions of adjacent transistors. FIG. 5B depicts isolation structures 582 of the related art positioned between adjacent channel regions of adjacent transistors, and separated by an isolation structure 580 (e.g., a contiguous isolation structure) in accordance with an embodiment positioned between adjacent source/drain regions of adjacent transistors.

Figure 5C:
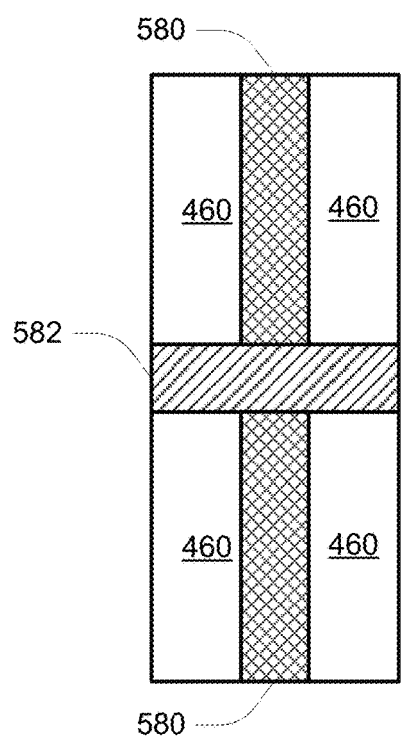
Figure 5D:
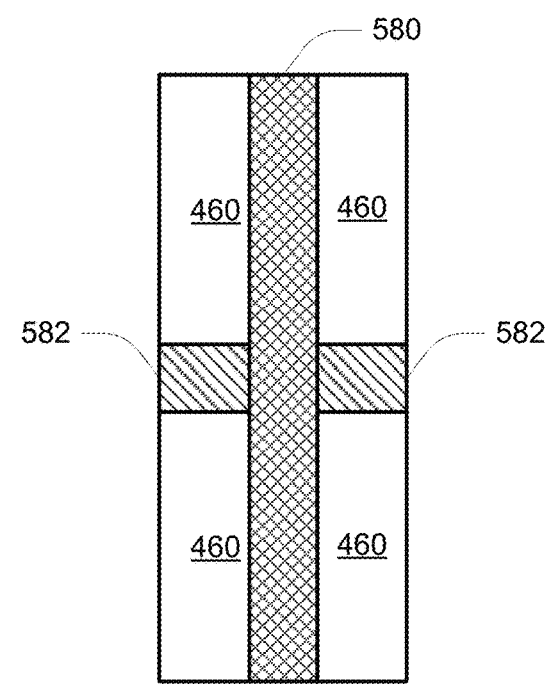

FIG. 5C depicts isolation structures 580 in accordance with an embodiment positioned between adjacent channel regions of adjacent transistors, and separated by an isolation structure 582 (e.g., a contiguous isolation structure) of the related art positioned between adjacent source/drain regions of adjacent transistors. FIG. 5D depicts isolation structures 582 of the related art positioned between adjacent source/drain regions of adjacent transistors, and separated by an isolation structure 580 (e.g., a contiguous isolation structure) in accordance with an embodiment positioned between adjacent channel regions of adjacent transistors.

Figure 5E:
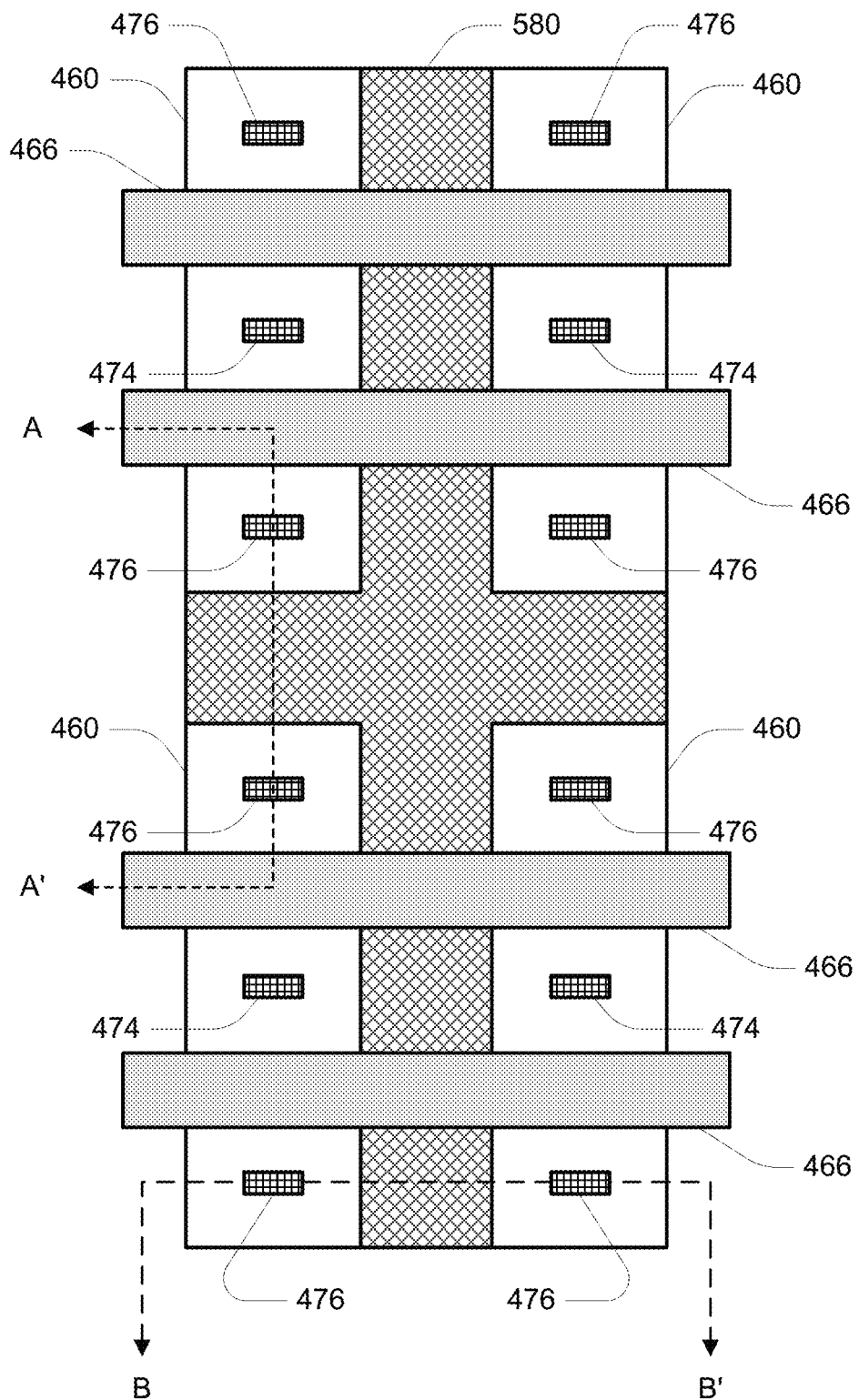

FIG. 5E depicts an isolation structure 580 (e.g., a contiguous isolation structure) in accordance with an embodiment positioned between adjacent source/drain regions of adjacent transistors, and positioned between adjacent channel regions of adjacent transistors.

Figure 6A:
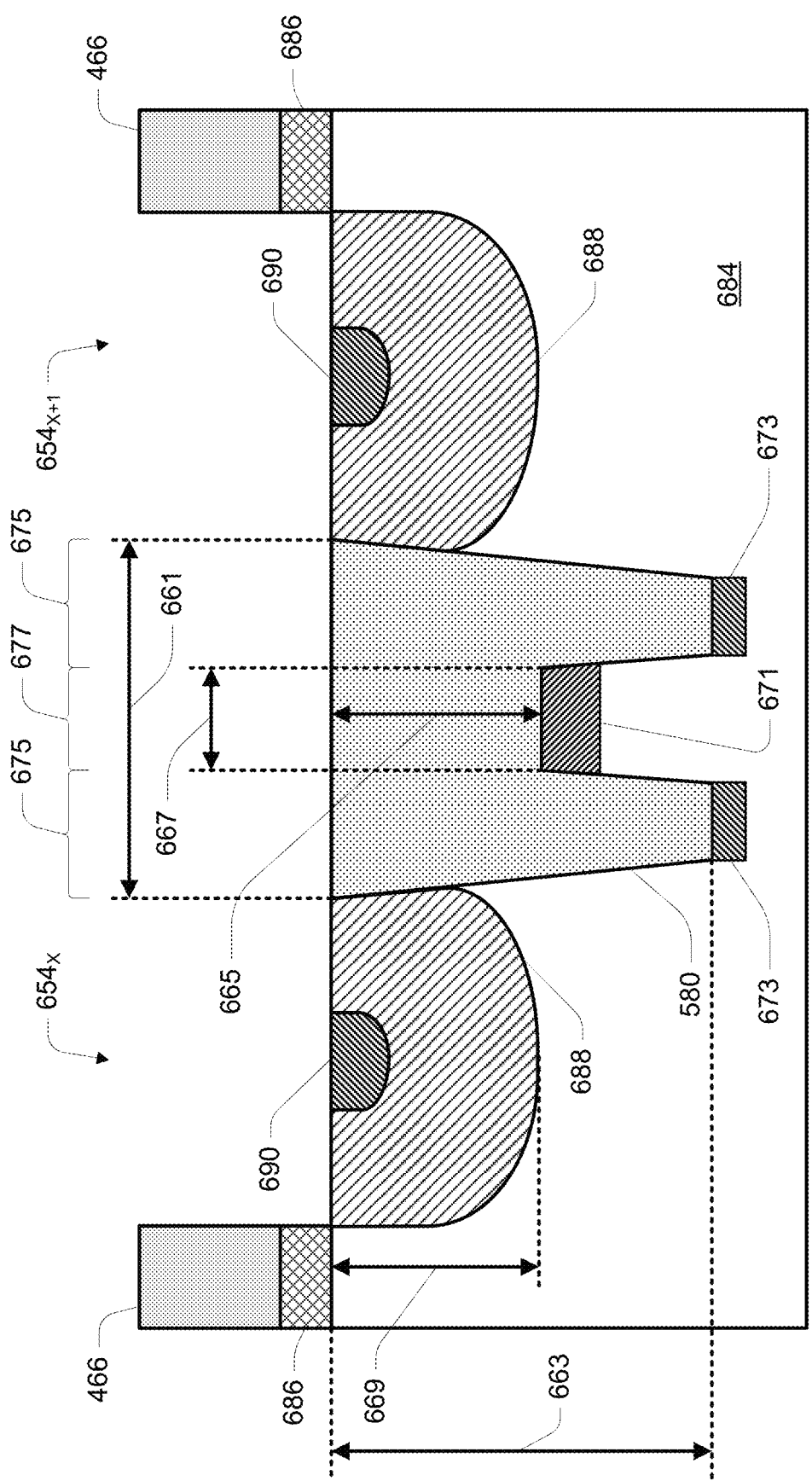
FIG. 6A is a cross-sectional view of an isolation structure taken along line A-A' of FIG. 5E in accordance with an embodiment.

FIG. 6A is a cross-sectional view of an isolation structure taken along line A-A' of FIG. 5E in accordance with an embodiment. FIG. 6A depicts portions of two transistors 654, e.g., $654_X$ and $654_{X+1}$, which might each correspond to a transistor 354 of FIG. 3B or 3C for string drivers of different blocks of memory cells. The transistors 654 are formed overlying (e.g., on) a semiconductor 684. The semiconductor 684 might contain monocrystalline silicon or other semiconductor material. The semiconductor 684 might have a conductivity type, e.g., a p-type conductivity. Isolation structure 580 might be formed in the semiconductor 684 to define the active areas 460 of FIG. 4. Such use of isolation structures might commonly be referred to as shallow trench isolation or STI.

A gate stack of each transistor 654 of FIG. 6A might include a dielectric 686 formed overlying (e.g., on) the semiconductor 684, and a conductor 466 formed overlying (e.g., on) a corresponding gate dielectric 686. The dielectric 686 might generally be formed of one or more dielectric materials, while the conductor 466 might generally be formed of one or more conductive materials. The dielectric 686 might correspond to a gate dielectric of its corresponding transistor 654, while the conductor 466 might correspond to a control gate of that corresponding transistor 654.

An extension region 688 might be formed in the semiconductor 684 adjacent each gate stack of the transistors 654. The extension region 688 might have a conductivity type different than (e.g., opposite of) the conductivity type of the semiconductor 684. Continuing with the example, the extension region 688 might have an n-type conductivity. The conductivity level of the extension region 688 might be referred to as lightly doped, e.g., having an n-conductivity.

A contact region 690 might be formed in each extension region 688, e.g., for an improved connection of a contact 476 (not shown in FIG. 6A) to the corresponding extension region 688. The contact regions 690 might have a conductivity type the same as the conductivity type of the extension regions 688, but at a higher conductivity level. For example, the contact regions 690 might have an n+ conductivity. The difference in conductivity levels might correspond to different levels of impurities, e.g., dopant species, implanted in the semiconductor 684. The level of impurities of the contact regions 690 might be an order of magnitude or more higher than the level of impurities of the extension regions 688. A contact region 690 and an extension region 688 of a transistor 654 might collectively be referred to as a source/drain region (e.g., drain) of that transistor 654.

The isolation structure 580 might be described to be W-shaped isolation structures when viewed in profile. The isolation structure 580 might have width 661 at a top surface, which might correspond to a maximum width of the isolation structure 580, and a depth 663 of edge portions 675, which might correspond to a maximum depth of the isolation structure 580. The isolation structure 580 might have an interior portion 677 between (e.g., and contiguous with) its edge portions 675 having a depth 665 less than the depth 663. The interior portion 677 of the isolation structure 580 might have a width 667. For some embodiments, the depth 665 of the isolation structure 580 might be substantially equal to (e.g., equal to) a depth 669 of the source/drain regions of the transistors 654. For further embodiments, the depth 665 of the isolation structure 580 might be greater than or equal to the depth 669 of the source/drain regions of the transistors 654. For other embodiments, the depth 665 of the isolation structure 580 might be less than the depth 669 of the source/drain regions of the transistors 654. The edge portions 675 might be outermost portions of the isolation structure 580 as viewed in profile, while the interior portion 677 might be an innermost portion of the isolation structure 580 as viewed in profile.

The isolation structure 580 might have a first conductive region 671 under the interior portion 677, and second conductive regions 673 under the edge portions 675. The first conductive region 671 and the second conductive regions 673 might have a same conductivity type as the semiconductor 684. The first conductive region 671 might have a higher conductivity level than the second conductive regions 673. The first conductive region 671 might have a depth, e.g., extending from and below a bottom surface of the interior portion 677, of 20-30 nm, while the second conductive regions 673 might have a depth, e.g., extending from and below bottom surfaces of the edge portions 675, of less than 100 nm. For some embodiments, the depth of the first conductive region 671 is greater than the depth of the second conductive regions 673.

As one example, the width 661 of the isolation structure 580 might be greater than or equal to 0.4 µm. As a further example, the width 661 might range from 0.4 µm to 0.81 µm. As a still further example, the width 661 might range from 0.61 µm to 0.81 µm. As one example, the depth 663 of the isolation structure 580 might be greater than or equal to 0.48 µm. As a further example, the depth 663 might range from 0.58 µm to 0.68 µm. As one example, the depth 665 might be greater than or equal to 0.38 µm. As one example, the width 667 of the interior portion 677 of the isolation structure 580 might be greater than or equal to 0.1 µm. As a further example, the width 667 might be greater than or equal to 0.22 µm.

Figure 6B:
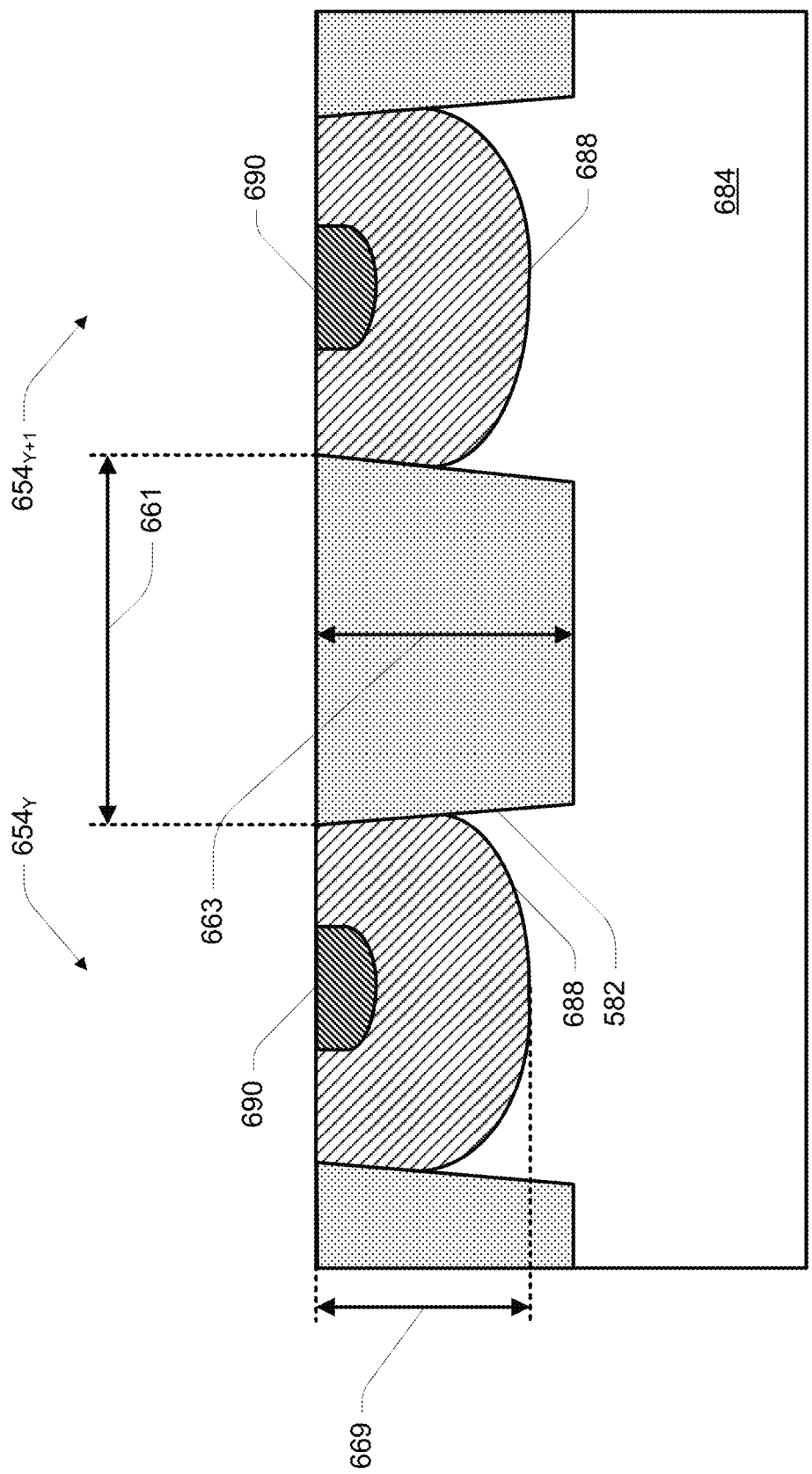
FIG. 6B is a cross-sectional view of an isolation structure of the related art taken along a same orientation as line B-B' of FIG. 5E.

FIG. 6B is a cross-sectional view of an isolation structure of the related art taken along a same orientation as line B-B' of FIG. 5E. FIG. 6B depicts portions of two transistors 654, e.g., $654_Y$ and $654_{Y+1}$, which might each correspond to a transistor 354 of FIG. 3B or 3C of a string driver for different access lines of a same block of memory cells. FIG. 6B further depicts an isolation structure 582 of the related art such as might be positioned for use in the embodiments depicted in FIGS. 5A and 5B. Elements of same reference numbers in FIG. 6B might correspond to their description with reference to FIG. 6A. The isolation structure 582 might be described to be a U-shaped isolation structure.

The need for isolation between adjacent channels of adjacent transistors might be lesser relative to the need for isolation between adjacent source/drain regions of adjacent transistors. Accordingly, some embodiments might incorporate an isolation structure 580 between adjacent source/drain regions, but might be able to incorporate a more simplistic isolation structure, such as isolation structure 582, between adjacent channel regions. The isolation structure 582 of FIG. 6B depicts just one possible style of isolation structure of the related art that might be used in conjunction with isolation structures 580 in accordance with embodiments. For some embodiments, the isolation structure 582 may further incorporate conductive regions, such as conductive regions 673 and 671, below its bottom surface, e.g., at its depth 663.

FIGS. 7A-7J and 8A-8J are cross-sectional views of isolation structures of FIG. 5E at various stages of fabrication in accordance with embodiments. FIGS. 7A-7J are cross-sectional views of isolation structures in accordance with embodiments taken along line A-A' of FIG. 5E. FIGS. 8A-8J are cross-sectional views of isolation structures in accordance with embodiments taken along line B-B' of FIG. 5E. For embodiments such as depicted in FIGS. 5A and 5B, FIGS. 7A-7J might represent fabrication of isolation structures 580, while FIGS. 8A-8J may be inapplicable. For embodiments such as depicted in FIGS. 5C and 5D, FIGS. 8A-8J might represent fabrication of isolation structures 580, while FIGS. 7A-7J may be inapplicable.

Figure 7B:
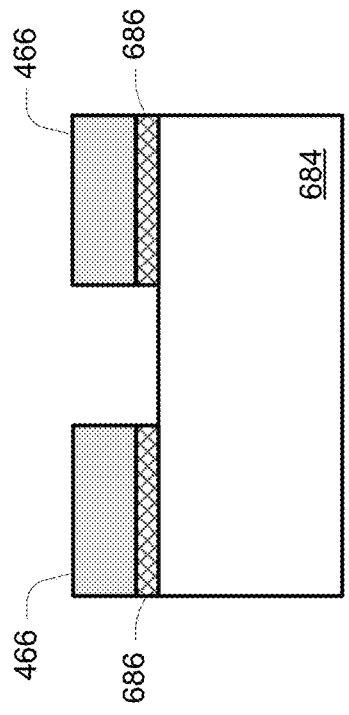
Figure 8B:
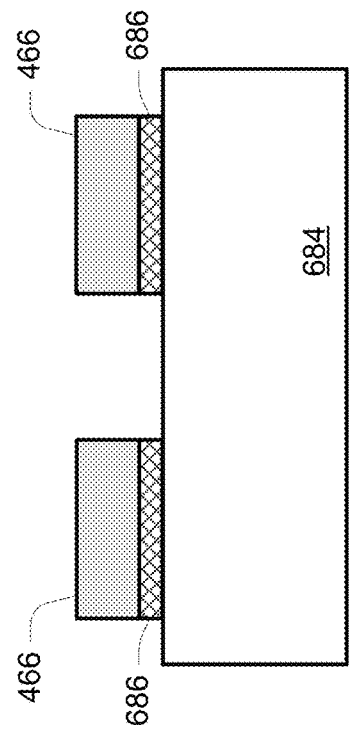
Figure 7A:
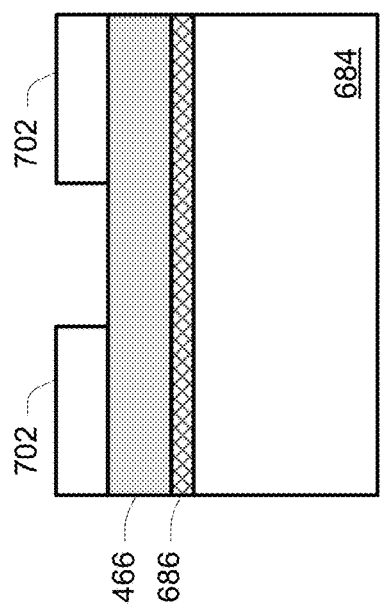
Figure 8A:
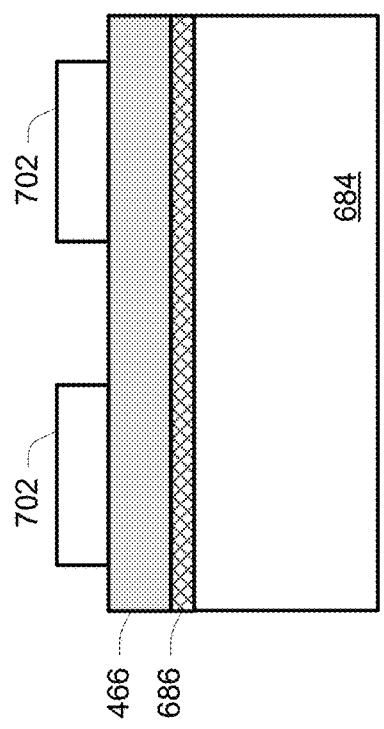

In FIGS. 7A and 8A, a dielectric 686 might be formed overlying (e.g., on) a semiconductor 684. The semiconductor 684 might contain monocrystalline silicon or other semiconductor material. The semiconductor 684 might have a conductivity type, e.g., a p-type conductivity. The dielectric 686 might be formed of one or more dielectric materials. For example, the dielectric 686 may comprise, consist of, or consist essentially of an oxide, e.g., silicon dioxide, and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides (HfSiO$_x$), lanthanum oxides (LaO$_x$), tantalum oxides (TaO$_x$), zirconium oxides (ZrO$_x$), zirconium aluminum oxides (ZrAlO$_x$), or yttrium oxide (Y$_2$O$_3$), as well as any other dielectric material.

A conductor 466 might be formed overlying (e.g., on) the dielectric 686. The conductor 466 might be formed of one or more conductive materials. The conductor 466 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A patterned mask 702 might be formed overlying (e.g., on) the conductor 466 to expose areas of the conductor 466 and dielectric 686 for removal. The mask 702 might represent a mask formed using a photolithographic process. Photolithographic processes are often used to define a desired pattern in integrated circuit fabrication. In a photolithographic process, a photoresist layer may be formed on the surface of the in-process device. The photoresist layer may contain a photo-sensitive polymer whose ease of removal is altered upon exposure to light or other electromagnetic radiation. To define the pattern, the photoresist layer may be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing. In a negative resist systems, the portions of the photoresist layer exposed to the radiation are photopolymerized and the photolithographic mask is designed to block the radiation from those portions of the photoresist layer that are to be removed by developing.

In FIGS. 7B and 8B, the exposed areas of the conductor 466 and the dielectric 686 are removed, e.g., anisotropically. For example, a reactive ion etch process might be used to remove portions of the conductor 466 and the dielectric 686 not covered by the patterned mask 702. The mask 702 might subsequently be removed, e.g., by ashing or otherwise removing the photoresist material.

In FIGS. 7C and 8C, a patterned mask 704 might be formed overlying (e.g., on) the conductor 466 and semiconductor 684 to expose areas of the semiconductor 684. The mask 704 might represent a mask formed using a photolithographic process. The first conductive region 671 might be formed by implanting dopant species into the exposed areas of the semiconductor 684. As is well understood in the art, such implantation might commonly involve acceleration of ions directed at a surface of the semiconductor 684 such as conceptually depicted by arrows 706. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known and embodiments herein are not limited to any method of forming the conductive regions.

The first conductive region 671 might be formed to have a same conductivity type as the semiconductor 684, but at a higher conductivity level. As one example, the first conductive region 671 might be formed using a beam-line implantation process with a boron impurity using a power level of approximately 100 keV and a dose of approximately 2E12/cm^2. With such an implantation process, the first conductive region 671 might extend to a depth of approximately 0.38 μm and below. The first conductive region 671 might have a width 708. The width 708 might be greater than or equal to the width 667 of FIG. 6A. Alternatively, the width 708 might be less than the width 667 of FIG. 6A. The mask 704 might subsequently be removed.

In FIGS. 7D and 8D, a patterned mask 710 might be formed overlying (e.g., on) the conductor 466 and semiconductor 684 to expose areas of the semiconductor 684. The mask 710 might represent a mask formed using a photolithographic process. Exposed portions of the semiconductor 684 might be removed, e.g., anisotropically, to form trench portions 712.

In FIGS. 7E and 8E, a portion of the patterned mask 710 might be removed, e.g., the portion of the patterned mask 710 over the first conductive region 671. Alternatively, the patterned mask 710 of FIGS. 7E and 8E might represent a different patterned mask. Exposed portions of the semiconductor 684 might be further removed, e.g., anisotropically, to form trenches 714. The remaining portion of the patterned mask 710 might subsequently be removed.

In FIGS. 7F and 8F, the second conductive regions 673 might be formed by implanting dopant species into the exposed areas of the semiconductor 684. As is well understood in the art, such implantation might commonly involve acceleration of ions directed at a surface of the semiconductor 684 such as conceptually depicted by arrows 716. The second conductive regions 673 might be formed to have a same conductivity type as the semiconductor 684. The second conductive regions 673 might have a higher conductivity level than the semiconductor 684, and might further have a lower conductivity level than the first conductive regions 671. As one example, the second conductive regions 673 might be formed using a beam-line implantation process with a boron impurity using a power level of approximately 10 keV and a dose of approximately 1E12/cm^2. With such an implantation process, the second conductive regions 673 might extend to a depth of approximately 0-100 nm below the exposed surfaces of the semiconductor 684. A mask may be unnecessary as the conductors 466 might serve to limit the areas of implantation.

Figure 7H:
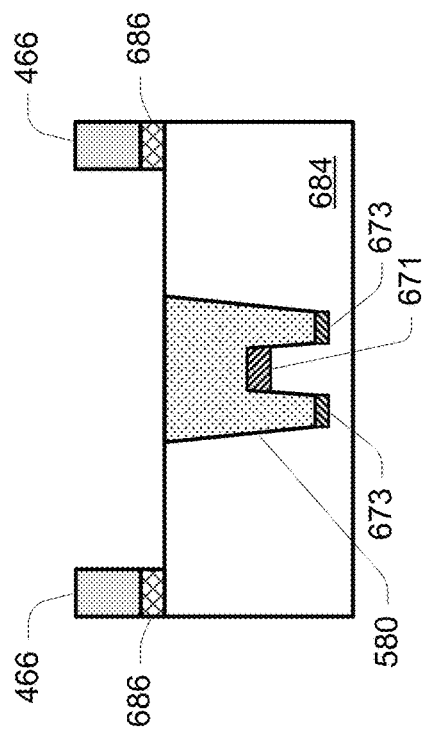
Figure 8H:
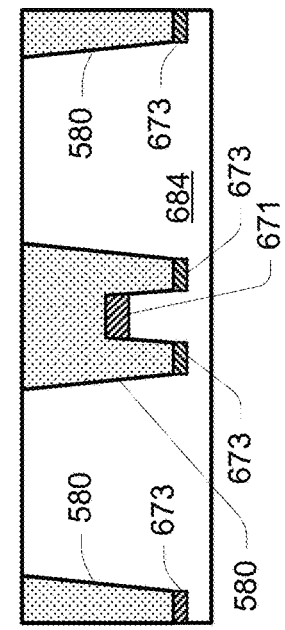
Figure 7G:
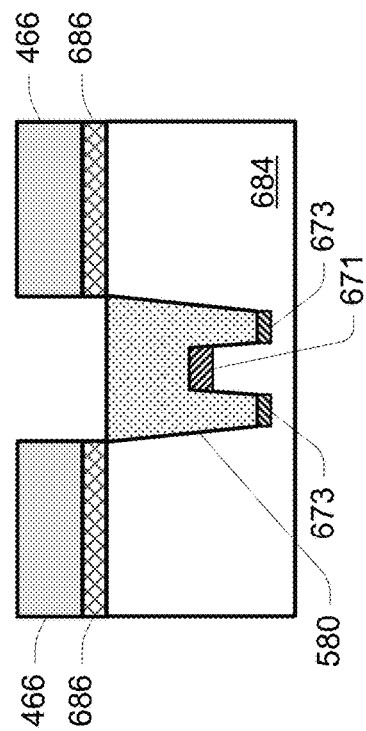
Figure 8G:
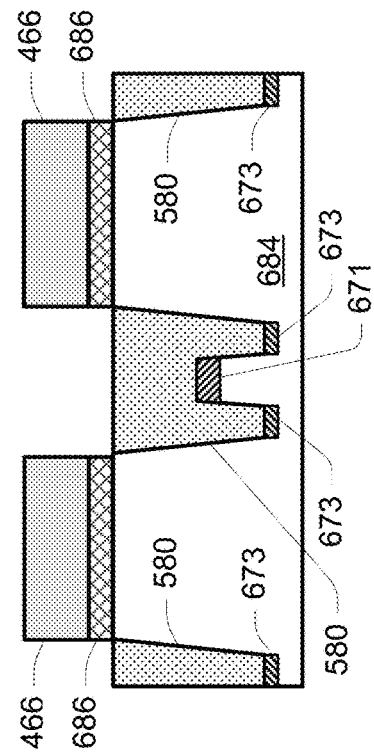

In FIGS. 7G and 8G, the trenches 714 might be filled with dielectric material to form isolation structures 580. Filling the trenches 714 with dielectric material might include a high-density plasma (HDP) deposition and/or spin-on dielectric (SOD) process, for example. An etch process might be used to remove excess dielectric material. In FIGS. 7H and 8H, the conductors 466 and dielectrics 686 might be patterned to define control gates and gate dielectrics, respectively, for the transistors 654 of FIG. 6A, for example.

In FIGS. 7I and 8I, the extension regions 688 might be formed in the semiconductor 684, and the contact regions 690 might be formed in the extension regions 688. Forming the extension regions 688 might include conductively doping portions of the semiconductor 684 not covered by the conductor 466, while forming the contact regions 690 might include conductively doping portions of the extension regions 688 not covered by a mask (not shown in FIG. 7I or 8I). For example, the extension region 688 might be formed by implanting respective dopant species into the semiconductor 684. As is well understood in the art, such implantation might commonly involve acceleration of ions directed at a surface of the semiconductor 684. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known. Although implanting dopant species for the extension regions 688 might be self-aligned to the gate stacks, it might further be expected for the extension regions 688 to extend beneath the dielectrics 686. In FIGS. 7J and 8J, contacts 476 might be formed to be in contact with the contact regions 690.

Figure 9:
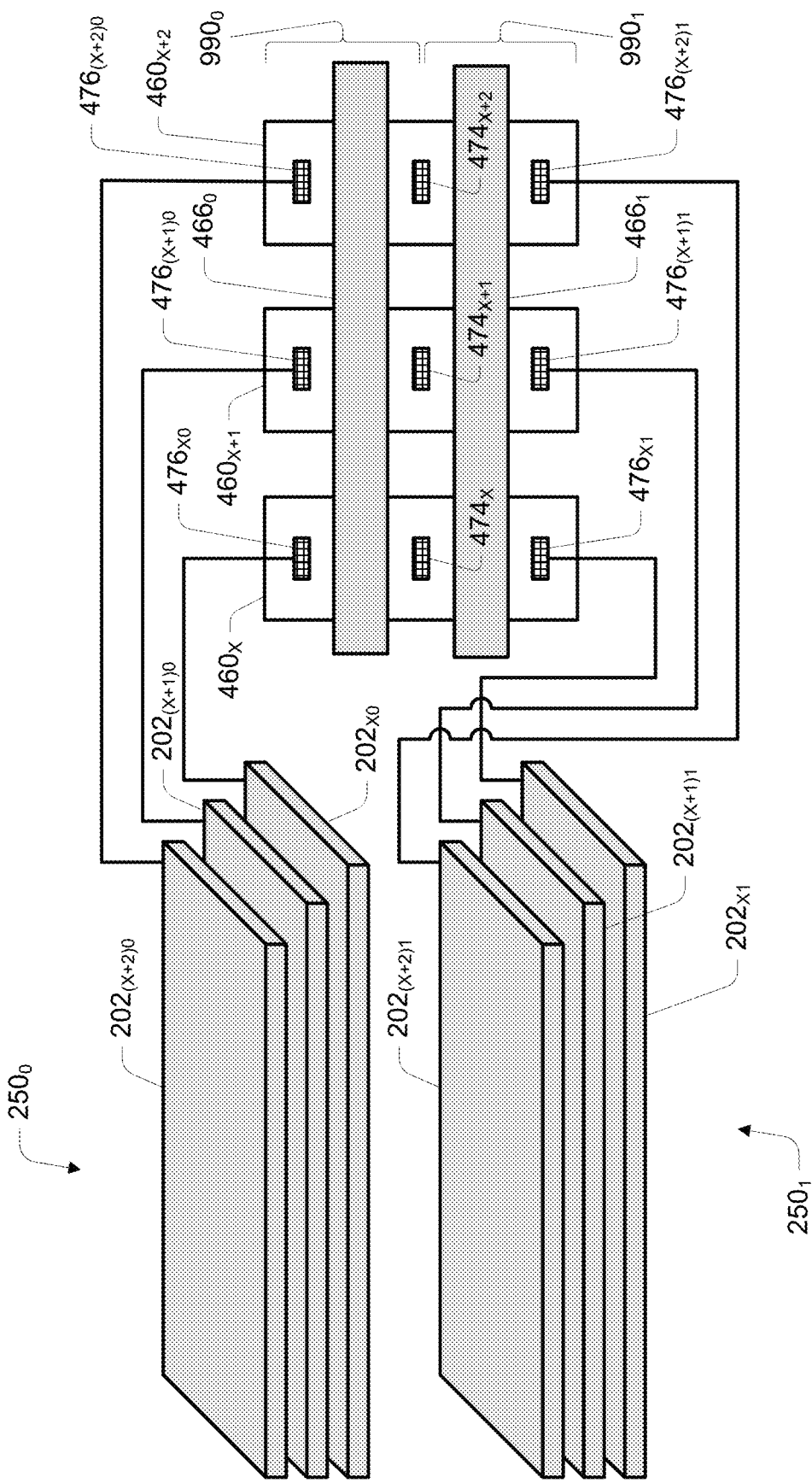
FIG. 9 conceptually depicts connection of a portion of a string driver connected to access lines of multiple blocks of memory cells in accordance with an embodiment.

FIG. 9 conceptually depicts connection of a portion of a string driver connected to access lines of multiple blocks of memory cells in accordance with an embodiment. Although not depicted in FIG. 9, the adjacent transistors of the string drivers 990 might be separated by an isolation structure 580 in accordance with an embodiment positioned between adjacent source/drain regions of the adjacent transistors, and/or separated by an isolation structure 580 in accordance with an embodiment positioned between adjacent channel regions of the adjacent transistors.

In FIG. 9, a first string driver $990_0$ might have transistors (not enumerated in FIG. 9) corresponding to conductor $466_0$ and connected between first contacts 474, e.g., first contacts $474_X$, $474_{X+1}$, and $474_{X+2}$, and corresponding second contacts 476, e.g., second contacts $476_{X0}$, $476_{(X+1)0}$, and $476_{(X+2)0}$, respectively, and a second string driver $990_1$ might have transistors (not enumerated in FIG. 9) corresponding to conductor 4661 and connected between first contacts 474, e.g., first contacts $474_X$, $474_{X+1}$, and $474_{X+2}$, and corresponding second contacts 476, e.g., second contacts $476_{X1}$, $476_{(X+1)1}$, and $476_{(X+2)1}$, respectively. The active areas $460_X$, $460_{X+1}$, and $460_{X+2}$ might have isolation structures 580 (not shown in FIG. 9) formed between adjacent source/drain regions of adjacent transistors and/or between adjacent channel regions of adjacent transistors as depicted in FIGS. 5A-5D.

The second contacts $476_{X0}$, $476_{(X+1)0}$, and $476_{(X+2)0}$ of the first string driver $990_0$ might be connected to word lines $202_{X0}$, $202_{(X+1)0}$, and $202_{(X+2)0}$, respectively, of a block of memory cells $250_0$. The word lines $202_{X0}$, $202_{(X+1)0}$, and $202_{(X+2)0}$ might represent only a portion of word lines of the block of memory cells $250_0$. For example, the block of memory cells $250_0$ might include N+1 word lines 202 such as depicted in FIG. 2A, and the word lines $202_{X0}$, $202_{(X+1)0}$, and $202_{(X+2)0}$ of the block of memory cells $250_0$ might correspond to word lines $202_X$, $202_{X+1}$, and $202_{X+2}$, respectively, of FIG. 2A.

The second contacts $476_{X1}$, $476_{(X+1)1}$, and $476_{(X+2)1}$ of the second string driver $990_1$ might be connected to word lines $202_{X1}$, $202_{(X+1)1}$, and $202_{(X+2)1}$, respectively, of a block of memory cells $250_1$. The word lines $202_{X1}$, $202_{(X+1)1}$, and $202_{(X+2)1}$ might represent only a portion of word lines of the block of memory cells $250_1$. For example, the block of memory cells $250_1$ might include N+1 word lines 202 such as depicted in FIG. 2A, and the word lines $202_{X1}$, $202_{(X+1)1}$, and $202_{(X+2)1}$ of the block of memory cells $250_1$ might correspond to word lines $202_X$, $202_{X+1}$, and $202_{X+2}$, respectively, of FIG. 2A.

The string drivers $990_0$ and $990_1$ might be a portion of the peripheral circuitry 226 of FIG. 2C. For example, the string driver $990_0$ might be formed under (e.g., at least partially under) the word lines $202_{X0}$, $202_{(X+1)0}$, and $202_{(X+2)0}$ of the block of memory cells $250_0$. Similarly, the string driver $990_1$ might be formed under (e.g., at least partially under) the word lines $202_{X1}$, $202_{(X+1)1}$, and $202_{(X+2)1}$ of the block of memory cells $250_1$.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming an isolation structure, comprising:
   forming a first conductive region in a first section of a semiconductor material;
   forming a first trench in a second section of the semiconductor material adjacent a first side of the first section of the semiconductor material and forming a second trench in a third section of the semiconductor material adjacent a second side of the first section of the semiconductor material that is opposite the first side of the first section of the semiconductor material;
   extending the first trench to a depth below the first conductive region, extending the second trench to the depth below the first conductive region, and removing a portion of the first section of the semiconductor material overlying the first conductive region;
   forming a second conductive region in the semiconductor material below a bottom of the first trench and forming a third conductive region in the semiconductor material below a bottom of the second trench; and
   forming a dielectric material overlying the first conductive region and filling the first trench and the second trench.

2. The method of claim 1, wherein forming the first trench in the second section of the semiconductor material and forming the second trench in the third section of the semiconductor material are performed while a mask overlies the first section of the semiconductor material and while the second section of the semiconductor material and the third section of the semiconductor material are exposed.

3. The method of claim 2, wherein extending the first trench, extending the second trench, and removing the portion of the first section of the semiconductor material overlying the first conductive region are performed while the first section of the semiconductor material, the second section of the semiconductor material, and the third section of the semiconductor material are exposed.

4. The method of claim 1, wherein forming the first trench in the second section of the semiconductor material and forming the second trench in the third section of the semiconductor material comprises anisotropically removing a portion of the second section of the semiconductor material and anisotropically removing a portion of the third section of the semiconductor material.

5. The method of claim 4, wherein extending the first trench, extending the second trench, and removing the portion of the first section of the semiconductor material overlying the first conductive region comprises anisotropically removing a further portion of the second section of the semiconductor material, anisotropically removing a further portion of the third section of the semiconductor material, and anisotropically removing the portion of the first section of the semiconductor material overlying the first conductive region.

6. The method of claim 1, wherein forming the first conductive region in the first section of the semiconductor material comprises implanting a dopant species into the first section of the semiconductor material.

7. The method of claim 6, wherein forming the first conductive region in the first section of the semiconductor material further comprises forming the first conductive region to have a same conductivity type as the semiconductor material.

8. The method of claim 7, wherein forming the first conductive region in the first section of the semiconductor material further comprises forming the first conductive region to have a higher conductivity level than the semiconductor material.

9. A method of forming an isolation structure, comprising:
forming a first dielectric material overlying a semiconductor material having a first conductivity type;
forming a conductive material overlying the first dielectric material;
removing a portion of the conductive material and a portion of the first dielectric material to expose a first section of the semiconductor material, a second section of the semiconductor material adjacent a first side of the first section of the semiconductor material, and a third section of the semiconductor material adjacent a second side of the first section of the semiconductor material that is opposite the first side of the first section of the semiconductor material;
forming a first conductive region having the first conductivity type in the first section of the semiconductor material;
forming a first trench in the second section of the semiconductor material and forming a second trench in the third section of the semiconductor material;
extending the first trench to a depth below the first conductive region, extending the second trench to the depth below the first conductive region, and removing a portion of the first section of the semiconductor material overlying the first conductive region;
forming a second conductive region having the first conductivity type in the portion of the semiconductor material below a bottom of the first trench and forming a third conductive region having the first conductivity type in the portion of the semiconductor material below a bottom of the second trench; and
forming a second dielectric material overlying the first conductive region and filling the first trench and the second trench.

10. The method of claim 9, wherein forming the first dielectric material comprises forming a dielectric material comprising at least one material selected from a group consisting of silicon dioxide, an aluminum oxide, a hafnium oxide, a hafnium aluminum oxide, a hafnium silicon oxide, a lanthanum oxide, a tantalum oxide, a zirconium oxide, a zirconium aluminum oxide, and yttrium oxide.

11. The method of claim 10, wherein forming the second dielectric material comprises performing a high-density plasma deposition or a spin-on dielectric process.

12. The method of claim 9, wherein forming the conductive material comprises forming at least one conductive material selected from a group consisting of conductively doped polysilicon, a refractory metal, a refractory metal silicide, and a refractory metal nitride.

13. The method of claim 9, further comprising:
removing a first additional portion of the conductive material and a first additional portion of the first dielectric material to expose a fourth section of the semiconductor material adjacent a first edge of the second dielectric material and removing a second additional portion of the conductive material and a second additional portion of the first dielectric material to expose a fifth section of the semiconductor material adjacent a second edge of the second dielectric material opposite the first edge of the second dielectric material;
forming a first extension region in the fourth section of the semiconductor material and forming a second extension region in the fifth section of the semiconductor material, wherein the first extension region and the second extension region each have a second conductivity type different than the first conductivity type, and each have a first conductivity level;
forming a first contact region in the first extension region and forming a second contact region in the second extension region, wherein the first contact region and the second contact region each have the second conductivity type and a second conductivity level higher than the first conductivity level; and
forming a first contact to the first contact region and forming a second contact to the second contact region.

14. The method of claim 13, wherein forming the first extension region in the fourth section of the semiconductor material comprises forming the first extension region in the fourth section of the semiconductor material to extend from the first edge of the second dielectric material to beyond a first edge of the first dielectric material, and wherein forming the second extension region in the fifth section of the semiconductor material comprises forming the second extension region in the fifth section of the semiconductor material to extend from the second edge of the second dielectric material to beyond a second edge of the first dielectric material.

15. A method of forming an isolation structure, comprising:
forming a first conductive region at a first depth in a first section of a semiconductor material having a first conductivity type and a first conductivity level, wherein the first conductive region has the first conductivity type and has a second conductivity level higher than the first conductivity level;
forming a first trench in a second section of the semiconductor material adjacent a first side of the first section of the semiconductor material and forming a second trench in a third section of the semiconductor material adjacent a second side of the first section of the semiconductor material that is opposite the first side of the first section of the semiconductor material;
concurrently extending the first trench to a second depth greater than the first depth, extending the second trench to the second depth, and removing a portion of the first section of the semiconductor material overlying the first conductive region;
forming a second conductive region in the semiconductor material below a bottom of the first trench and forming a third conductive region in the semiconductor material below a bottom of the second trench, wherein the second conductive region and the third conductive region each have the first conductivity type and each have a third conductivity level higher than the first conductivity level and lower than the second conductivity level;
forming a dielectric material overlying the first conductive region and filling the first trench and the second trench; and
forming a first extension region in a fourth section of the semiconductor material adjacent the second section of the semiconductor material and forming a second extension region in a fifth section of the semiconductor material adjacent the third section of the semiconductor material, wherein the first extension region and the second extension region each have a second conductivity type different than the first conductivity type, wherein the first extension region is formed to be in contact with the dielectric material on a first side of the isolation structure, and wherein the second extension region is formed to be in contact with the dielectric material on a second side of the isolation structure opposite the first side of the isolation structure.

16. The method of claim 15, wherein the first extension region and the second extension region are formed to have respective depths less than or equal to the first depth.

17. The method of claim 15, wherein the first extension region and the second extension region are formed to have respective depths greater than the first depth.

18. The method of claim 15, wherein forming the first conductive region using a beam-line implantation process having a first power level, and wherein forming the second conductive region and forming the third conductive region comprises using a beam-line implantation process having a second power level that is an order of magnitude lower than the first power level.

19. The method of claim 18, wherein forming the first conductive region using the beam-line implantation process having the first power level and forming the second conductive region and forming the third conductive region using the beam-line implantation process having the second power level comprises forming the first conductive region using the beam-line implantation process having the first power level and a first dose of an impurity and forming the second conductive region and forming the third conductive region using the beam-line implantation process having the second power level and a second dose of the impurity that is lower than the first dose of the impurity.

20. The method of claim 18, wherein forming the first conductive region using the beam-line implantation process having the first power level and forming the second conductive region and forming the third conductive region using the beam-line implantation process having the second power level comprises forming the first conductive region using the beam-line implantation process having the first power level and a first dose of an impurity and forming the second conductive region and forming the third conductive region using the beam-line implantation process having the second power level and a second dose of the impurity that is half the first dose of the impurity.

* * * * *